(12) United States Patent
Meng (10) Patent No.: US 11,057,069 B2
(45) Date of Patent: Jul. 6, 2021

(54) RADIO FREQUENCY (RF) FRONT END OF LOW POWER CONSUMPTION AND FULLY AUTOMATIC ADJUSTABLE BROADBAND RECEIVER

(71) Applicants: VeriSilicon Microelectronics (Shanghai) Co., Ltd., Shanghai (CN); VeriSilicon Holdings Co., Ltd., Cayman Islands (GB)

(72) Inventor: Fanzhen Meng, Shanghai (CN)

(73) Assignees: VeriSilicon Microelectronics (Shanghai) Co., Ltd., Shanghai (CN); VeriSilicon Holdings Co., Ltd., Grand Cayman (KY)

( * ) Notice: Subject to any disclaimer, the term of this patent is extended or adjusted under 35 U.S.C. 154(b) by 0 days.

(21) Appl. No.: 16/984,167

(22) Filed: Aug. 4, 2020

(65) Prior Publication Data

US 2021/0075457 A1 Mar. 11, 2021

(30) Foreign Application Priority Data

Sep. 11, 2019 (CN) .......................... 201910860375.8

(51) Int. Cl.
*H04B 1/16* (2006.01)
*H04B 10/00* (2013.01)
(Continued)

(52) U.S. Cl.
CPC ............ *H04B 1/16* (2013.01); *H03F 1/0205* (2013.01); *H03F 1/42* (2013.01); *H03F 3/19* (2013.01);
(Continued)

(58) Field of Classification Search
CPC .......... H04B 1/16; H04B 1/40; H04B 1/1027; H04B 17/21; H04B 17/318; H04B 17/309;
(Continued)

(56) References Cited

U.S. PATENT DOCUMENTS

7,437,133 B2 * 10/2008 Mudd ..................... H03J 5/244
455/316
7,593,491 B1 * 9/2009 Khlat ...................... H04B 1/30
455/226.2
(Continued)

*Primary Examiner* — Quochien B Vuong (57) ABSTRACT

The present disclosure provides a radio frequency (RF) front-end of a low power consumption and fully automatic adjustable broadband receiver, including a low-noise amplification module, amplifying an broadband single-ended RF signal, and converting it into differential current signal; a local oscillator, generating a local oscillator signal; an quadrature mixer, quadraturely mixing the differential current signal and the local oscillator signal to generate intermediate frequency differential current signals; a transimpedance amplifier, converting the intermediate frequency differential current signal into an intermediate frequency differential voltage signal; an IIP2 calibration module, reducing the IIP2 effect of the RF front end; a received signal strength indicator module, sending the first amplification factor control signal and the differential mismatch control signal to the low noise amplification module, and sending the second amplification factor control signal to the transimpedance amplifier, thereby making the intermediate frequency differential voltage signals meet the requirements of the amplitude and mismatch.

8 Claims, 6 Drawing Sheets

(51) Int. Cl.
*H04B 17/318* (2015.01)
*H03F 1/02* (2006.01)
*H03F 1/42* (2006.01)
*H03F 3/19* (2006.01)
*H04B 1/10* (2006.01)

(52) U.S. Cl.
CPC ......... *H04B 1/1027* (2013.01); *H04B 17/318* (2015.01); *H03F 2200/294* (2013.01); *H03F 2200/36* (2013.01); *H03F 2200/451* (2013.01)

(58) Field of Classification Search
CPC ........ H03F 1/02; H03F 1/0205; H03F 1/0211; H03F 1/42; H03F 3/19; H03F 2200/451; H03F 2200/294
See application file for complete search history.

(56) References Cited

U.S. PATENT DOCUMENTS

| | | | | |
|---|---|---|---|---|
| 7,949,320 | B1* | 5/2011 | Lee | H04B 17/318 455/226.4 |
| 8,126,422 | B2* | 2/2012 | Connell | H04B 1/30 455/338 |
| 9,755,678 | B2* | 9/2017 | Selvanayagam | H03F 3/45179 |
| 10,848,112 | B2* | 11/2020 | Geha | H03F 3/191 |
| 10,903,798 | B2* | 1/2021 | Bozorg | H03F 3/19 |

* cited by examiner

RADIO FREQUENCY (RF) FRONT END OF LOW POWER CONSUMPTION AND FULLY AUTOMATIC ADJUSTABLE BROADBAND RECEIVER

CROSS REFERENCES TO RELATED APPLICATIONS

This application claims the benefit of priority to Chinese Patent Application No. CN201910860375.8, entitled "Radio Frequency (RF) Front End of Low Power Consumption and Fully Automatic Adjustable Broadband Receiver", filed with CNIPO on Sep. 11, 2019, the contents of which are incorporated herein by reference in its entirety.

TECHNICAL FIELD

The present disclosure relates to the technical field of broadband multi-mode, low power consumption and high integration of wireless communication, in particular to radio frequency (RF) front end of a low power consumption and fully automatic adjustable broadband receiver.

BACKGROUND

With the continuous development of wireless communication technology and the increasing demands for of wireless communication, wireless communication between people, between people and things, and between things and things is becoming important. In recent years, there are more new wireless communication protocols, especially in the field of internet of things (IoT) wireless communication, such as long range radio (LoRa), Narrow Band internet of things (NB-IoT), enhancements for machine type communications (eMTC) and the like. These wireless communication protocols can not only meet the requirements of new application scenarios, but also greatly enrich people's lifestyles, such as smart meter reading, smart parking, smart door locks, and smart homes. Since different regions have different management of frequency band resources, a wireless communication protocol may operate in different frequency bands in different countries. Therefore, it is increasingly important for wireless communication devices to be compatible with global frequency bands at the same time. In addition, in order to meet different wireless communication needs, it is important for devices to support different wireless communication protocols. Therefore, RF front-ends compatible with multiple modes and multiple frequency bands have become a hot topic.

At present, the field of wireless communication of the Internet of Things has been extensively studied, especially in broadband RF front-end. Meanwhile, the development of integrated circuit technology has made it possible for wireless communication products and devices compatible with multiple modes, and has further promoted the wireless communication devices to have small size and high integration. As the research progresses, there are more wireless communication products and devices that can meet the requirements of global frequency band communication and different wireless communication protocols. However, most of the products and devices receive signals using multiple RF channels, which greatly increase the size of wireless communication equipment, and a large number of RF front-ends used in these RF channels also increase the cost of the RF front-end accordingly. For example, for specific wireless communication applications, in order to avoid interference with other frequency bands, each RF front-end generally uses a corresponding off-chip surface acoustic wave (SAW) filter to suppress interference signals, and uses off-chip baluns to converts single-ended signals received by the RF antenna into differential signals to facilitate subsequent signal transmission. Therefore, if wireless communication devices are compatible with different RF channels and modes, a large number of SAW filters and balance-unbalance converters will be used, thereby greatly increasing volume and cost of wireless communication equipment.

In order to solve the cost and volume problems of wireless communication equipment, broadband RF front-ends with low-power, small size and highly integrated for IoT communications are particularly important. Meanwhile, wireless communication equipment also needs to flexibly change the signal amplification factor according to the intensity of receiving different RF signals to meet system requirements. Recently, there have been numerous research work and reports on the broadband RF front-end of wireless communication. For example, research paper "The BLIXER, a Wideband Balun-LNA-I/Q-Mixer Topology" has disclosed for ultra-broadband wireless communication, which receive signals using the RF front-end with the noise-canceling technique. The paper indicates that the receiving of broadband RF signals has been achieved and single-ended signals are converted into differential outputs, but the noise figure is high and the amplification factor of RF signals cannot be flexibly adjusted, which limits its application in wireless communications.

SUMMARY

The present disclosure provides a radio frequency (RF) front end of a low power consumption and fully automatic adjustable broadband receiver, which can meet the requirements of low power consumption, low noise, high integration, and can achieve automatic gain adjustment and flexible change of different bandwidths according to system requirements.

The present disclosure provides RF front end of a low power consumption and fully automatic adjustable broadband receiver, including: a low-noise amplification module, amplifying an broadband single-ended RF signal, and converting an amplified broadband single-ended RF signal into differential current signal, wherein the low-noise amplification module is allowed to adjust an amplification factor; a local oscillator, generating a local oscillator signal; an quadrature mixer, connected to the low-noise amplification module and the local oscillator, and quadraturely mixing the differential current signal and the local oscillator signal, so as to generate two-intermediate frequency differential current signals; a transimpedance amplifier, connected to the quadrature mixer, and converting the intermediate frequency differential current signal into an intermediate frequency differential voltage signal; an IIP2 calibration module, connected to the quadrature mixer, and adjusting the local oscillator signal received by the quadrature mixer, so as to reduce the IIP2 effect of the RF front end; a received signal intensity indicator module, connected to the transimpedance amplifier, wherein the received signal intensity indicator module comprises an analog processing module and a digital processing module; the analog processing module compares the intermediate frequency differential voltage signals to obtain differential amplitude and a mismatch degree; the digital processing module generates a first amplification factor control signal and a differential mismatch control signal according to the differential mismatch degree, sends the first amplification factor control signal and the differential mismatch control signal to the low noise amplification module, and generates a second amplification factor control signal, and sends the second amplification factor control signal to the transimpedance amplifier, thereby making the two intermediate frequency differential voltage signals meet the requirements of amplitude and mismatch.

In one embodiment of the present disclosure, the low-noise amplification module comprises an amplifier, a first differential amplifier output module, and a second differential amplifier output module; an input end of the amplifier is connected to the broadband RF signal, an output end of the amplifier is connected to an input end of the first differential amplification output module, an output end of the first differential amplification output module is connected to the quadrature mixer, and an input end of the second differential amplification output module is connected to the broadband RF signal, an output end of the second differential amplification output module is connected to the quadrature mixer.

In one embodiment of the present disclosure, the quadrature mixer uses a passive switch structure of complementary NMOS and PMOS, and the output has ground filter capacitors.

In one embodiment of the present disclosure, the transimpedance amplifier includes a differential operational amplifier, two capacitors, and two resistors; two ends of the capacitor are connected to the input end and the output end of the differential operational amplifier, respectively; and two ends of the resistor are connected to the input and output of the differential operational amplifier, respectively.

In the present disclosure, the RF front end of a low power consumption and fully automatic adjustable broadband receiver supports the frameworks of zero-IF and low-IF receivers.

In one embodiment of the present disclosure, the frequency of the broadband single-ended RF signal ranges from 400 MHz to 2.4 GHz.

In one embodiment of the present disclosure, the RF front end further includes an SPI interface for adjusting the bandwidth of the RF front end of a low power consumption and fully automatic adjustable broadband receiver.

In one embodiment of the present disclosure, the RF front end of a low power consumption and fully automatic adjustable broadband receiver is used for wireless communication and signal transmission for wide coverage Internet of Things.

As mentioned above, the RF front end of a low power consumption and fully automatic adjustable broadband receiver of the present disclosure has the following beneficial effects:

(1) The present application adopts a noise canceling current structure and feedback resistor, has low noise in the broadband range, and achieves better impedance matching with the RF antenna without off-chip RF matching network. Moreover, the present disclosure achieves the output of single-ended voltage signals to differential current signals, avoids the use of off-chip baluns, and supports the adjustment of the amplification factor.

(2) The present disclosure can perform linear analysis and comparison by using analog module according to the amplitude and mismatch degree of the differential output signal, and then send the gain control signal and differential mismatch control signal through the digital module to make the intermediate frequency differential voltage signal meet the requirements of amplitude and mismatch degree.

(3) The present disclosure can achieve broadband RF signal receiving by using the noise canceling structure, and meet the requirements of low power consumption, low noise and high integration.

(4) The present disclosure can achieve fully automatic adjustment of gain and flexible switching of different bandwidths according to system requirements, and support zero-IF framework and low-IF framework of wireless communication system receivers.

(5) The signal amplification and frequency conversion between modules adopt current transmission mode, which avoids problems of the impedance matching caused by the traditional voltage transmission mode. The present disclosure can meet the requirement of wide coverage of wireless communication, and achieve automatic adjustment of signal transmission.

BRIEF DESCRIPTION OF THE DRAWINGS

FIG. 3 (a) is the schematic diagram of the reflection coefficient S11 of the RF front end of a low power consumption and fully automatic adjustable broadband receiver according to the present disclosure;

FIG. 3 (b) is a schematic diagram of the noise figure NF of the RF front end of a low power consumption and fully automatic adjustable broadband receiver according to the present disclosure;

COMPONENT LABEL DESCRIPTION 10 low noise amplification module
101 amplifier
102 first differential amplification output module
103 second differential amplification output module
20 quadrature mixer
30 transimpedance amplifier
301, 304, 305, 308 capacitor
302, 303, 306, 307 resistor
309, 310 differential operational amplifier
40 local oscillator
50 IIP2 calibration module
60 received signal strength indicator module
601 analog processing module
602 digital processing module

DETAILED DESCRIPTION OF THE PREFERRED EMBODIMENTS

The embodiments of the present disclosure are described below with specific examples. Those skilled in the technology field can easily understand other advantages and effects of the present disclosure from the content disclosed in this specification.

It should be noted that the structures, proportions, sizes, etc. shown in the drawings in this specification are only used for matching the content disclosed in the description for those familiar with this technology to understand and read, and are not intended to limit the implementation of the disclosure. Therefore, it does not have technical significance. Any structural modification, proportional relationship change, or size adjustment without affecting the effects and goals that the invention producing must be within the scope of the present disclosed technical content. Meanwhile, the terms such as "upper", "lower", "left", "right", "middle", and "one" cited in this manual are only for the convenience of description and are not intended to limit the scope of the disclosure that can be implemented, the change or adjustment of its relative relationship, without substantial changes in the technical content, should also be regarded as the scope of the disclosure that can be implemented.

The radio frequency (RF) front end of a low power consumption and fully automatic adjustable broadband receiver of the present disclosure can meet the requirements of low power consumption, low noise and high integration, can achieve fully automatic adjustment of gain and flexible change of different bandwidths according to system requirements, and can support zero-IF (intermediate frequency) and low-IF architectures for wireless communication system receivers. The RF front end according to the present disclosure has a simple structure, good flexibility, and strong practicability.

Figure 1:
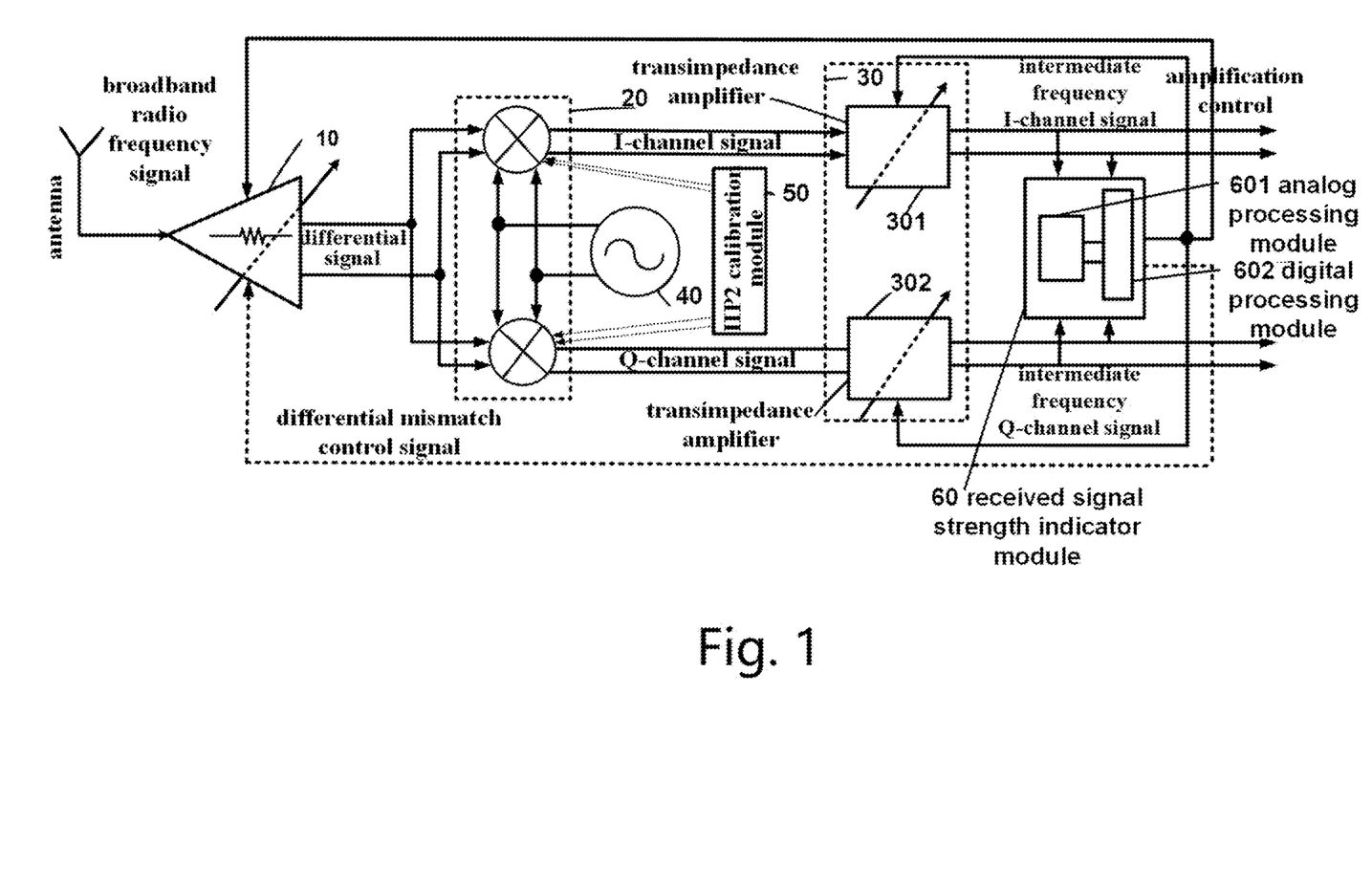
FIG. 1 is the principle schematic diagram of the RF front end of a low power consumption and fully automatic adjustable broadband receiver according to the present disclosure.

As shown in FIG. 1, in one embodiment, a RF front-end of a low power consumption and fully automatic adjustable broadband receiver is provided, at least including a low-noise amplification module 10, a quadrature mixer 20, and a transimpedance amplifier 30, the local oscillator 40, the IIP2 calibration module 50 and the received signal strength indicator module 60.

The low-noise amplification module 10 is used for amplifying the received broadband single-ended RF signal, and converting it into a differential current signal. The low-noise amplification module 10 also supports to adjust the signal amplification factors. In one embodiment of the present disclosure, a frequency of the broadband single-ended RF signal ranges from 400 MHz to 2.4 GHz.

Figure 2:
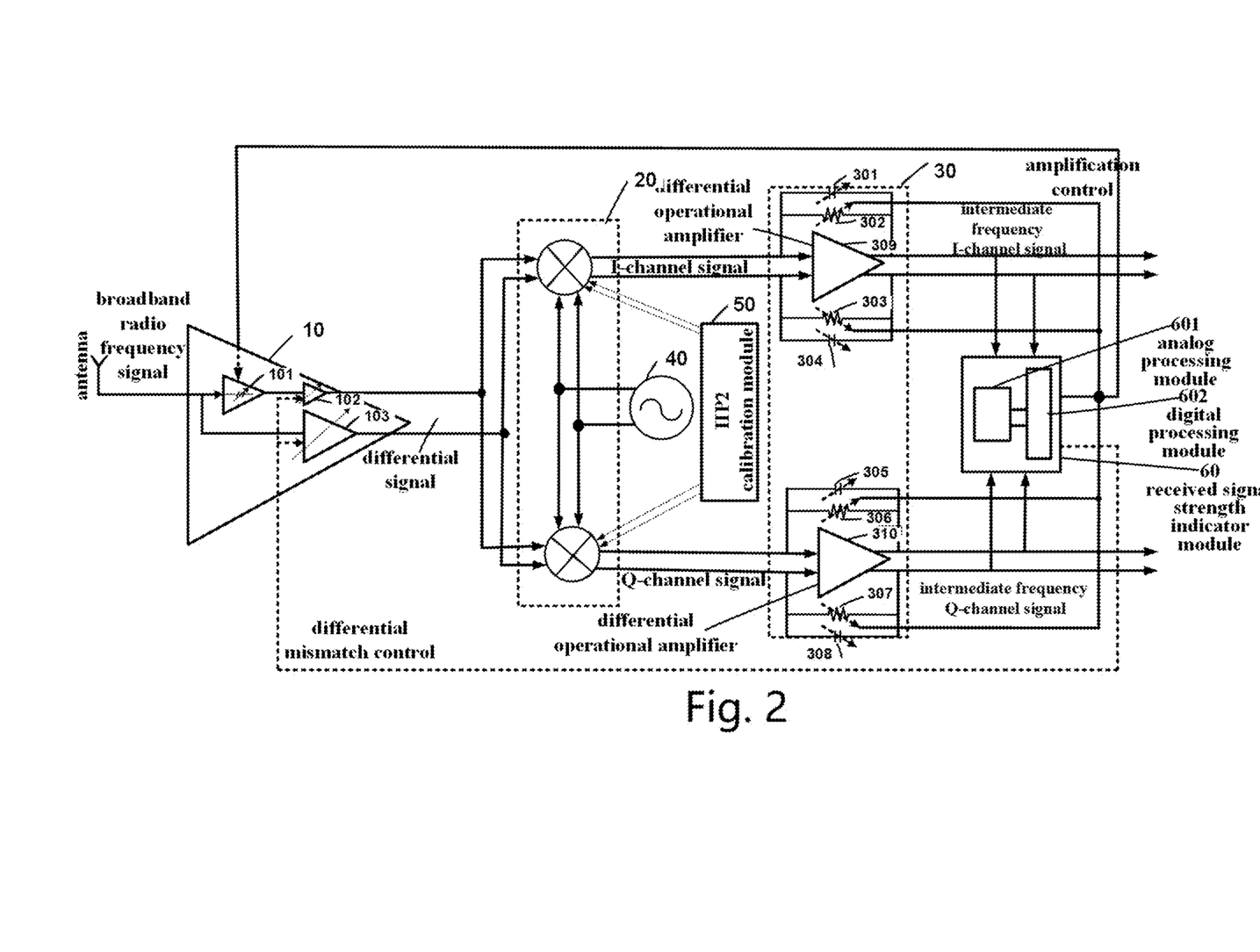
FIG. 2 is the framework schematic diagram of the RF front end of a low power consumption and fully automatic adjustable broadband receiver according to the present disclosure.

Specifically, as shown in FIG. 2, in one embodiment, the low noise amplifier module 10 includes an amplifier 101, a first differential amplification output module 102, and a second differential amplification output module 103. The amplifier 101 is used for amplifying the broadband RF signal. The input end of the amplifier 101 is connected to the broadband RF signal, and the output end of the amplifier 101 is connected to the input end of the first differential amplification output module 102. The first differential amplification output module 102 and the second differential amplification output module 103 are used for outputting a differential current signal, the output end of the first differential amplification output module 102 is connected to the quadrature mixer 20. The input end of the second differential amplification output module 103 is connected to the broadband RF signal, and the output end of the second differential amplification output module 103 is connected to the quadrature mixer 20.

The signal obtained after the broadband RF signal passing through the amplifier 101 and the first differential amplification output module 102 is a differential signal having the same amplification factors to that of the signal obtained after the broadband RF signal passing through the second differential amplification output module 103. The amplifier 101 achieves the impedance matching of broadband RF signal and signal amplification, and noise canceling with the first differential amplified output module 102 and the second differential amplified output module 103 based on the own feedback resistor, which convert the single-ended input of broadband single-ended RF signals into differential output, thereby facilitating the transmission of subsequent signals.

The local oscillator 40 is configured to generate a local oscillator (LO) signal.

The quadrature mixer 20 is connected to the low noise amplifier module 10 and the local oscillator 40, and is configured to perform quadrature mixing on the differential current signal and the local oscillator signal to generate an intermediate frequency differential current signal. Therefore, through the quadrature mixer 20 and the local oscillator 40, the generated differential current signal is converted into a quadrature intermediate frequency current signal, that is, an I-channel current signal and a Q-channel current signal.

In an exemplary embodiment, the quadrature mixer 20 uses a passive switch structure of complementary NMOS and PMOS, and has output filter ground capacitances, thereby achieve the high linear frequency conversion of the broadband RF signal with the differential current signal output by the low-noise amplification module 10 and the local oscillator signal output by the local oscillator 40 by using the passive components. Meanwhile, the output capacitors can suppress the broadband RF signal, the local oscillator signal and other high-frequency interference signals to some extent.

The transimpedance amplifier 30 is connected to the quadrature mixer 20 and is used for converting the two intermediate frequency differential current signals into two intermediate frequency differential voltage signals.

As shown in FIG. 2, in one embodiment, the transimpedance amplifier 30 includes a capacitor array 301, 304, 305, and 308, a resistor array 302, 303, 306, and 307, and differential operational amplifiers 309 and 310, each transimpedance amplifier is connected to an intermediate frequency differential current signal, thereby converting the corresponding intermediate frequency current signal to an intermediate frequency voltage signal, that is, an intermediate frequency I-channel voltage signal or an intermediate frequency Q-channel voltage signal. In one embodiment of the present disclosure, the transimpedance amplifier includes a differential operational amplifier, two capacitors, and two resistors. One end of the capacitors is connected to the input end of the differential operational amplifier, and the other end of the capacitors is connected to the output end of the differential operational amplifier. One end of the resistors is connected to the input end of the differential operational amplifier, and the other end of the resistors is connected to the output end of the differential operational amplifier. Therefore, the transimpedance amplifier 30 completes the current-to-voltage conversion with resistors load, and forms a first-order filter to suppress interference signals by using the resistor array and the capacitor array.

According to different bandwidth requirements of wireless communication, switching of different bandwidths can be achieved by adjusting the capacitor array of the transimpedance amplifier 30.

The received signal strength indicator module 60 is connected to the transimpedance amplifier 30, and is configured to send a first amplification factor control signal and a differential mismatch control signal to the low-noise amplification module 10 and send a second amplification factor control signal to the transimpedance amplifier 30 according to the two intermediate frequency differential voltage signals, so that the two intermediate frequency differential voltage signals can meet the requirements of amplitude and phase mismatch degrees.

In one embodiment of the present disclosure, the received signal strength indicator module 60 includes an analog processing module 601 and a digital processing module 602. The analog processing module 601 is configured to obtain a differential mismatch degree by comparing the two intermediate frequency differential voltage signals. The digital processing module 602 is connected to the analog processing module 601, and is configured to generate and send a first amplification factor control signal and a differential phase mismatch control signal to the low noise amplification module 10 according to the differential mismatch degree, and generate and send a second amplification factor control signal to the transimpedance amplifier 30.

Specifically, the received signal strength indicator module 60 adjusts the amplification factors of the low noise amplifier module 10 and the transimpedance amplifier 30 through a control signal, so that the output signal can be maintained at a proper level no matter the received RF signal is strong or weak, and the differential output mismatch degree of the low noise amplifier module 10 can be reduced by the control signal. Further, the analog processing module 601 determines the magnitude and phase mismatch of the two intermediate frequency differential voltage signals output by the transimpedance amplifier 30 by using the limiting amplification circuit and the comparator circuit.

The digital processing module 602 generates a first amplification factor control signal, a second amplification multiple control signal, and a differential mismatch control signal. The digital processing module 602 adjusts the feedback resistor of the amplifier 101 of the low-noise amplification module 10 and the resistors of the transimpedance amplifier 30 through an amplification control path, so as to achieve the adjustment of the amplification amplitude. The digital processing module 602 adjusts the first differential amplification output module 102 and the second differential amplification output module 103 of the low noise amplifier module 10 through a differential mismatch control path, so as to effectively control the error of differential output mismatch.

In one embodiment, the RF front end of the present disclosure further includes an IIP2 (input second-order interception point) calibration module 50. The IIP2 calibration module 50 is connected to the quadrature mixer 20 for adjusting the local oscillator signal received by the quadrature mixer 20. Specifically, the IIP2 calibration module 50 adjusts the local oscillator signal with different DC voltages, thereby reducing the IIP2 effect and effectively optimizing the IIP2 performance of the system.

In one embodiment the RF front end of the present disclosure further includes an SPI interface for adjusting the bandwidth of the RF front end of a low power consumption and fully automatic adjustable broadband receiver.

In one embodiment of the present disclosure, the RF front end of a low power consumption and fully automatic adjustable broadband receiver is applied to wireless communication of the Internet of Things.

The following further explains the principle of the RF front end of a low power consumption and fully automatic adjustable broadband receiver of the present disclosure. In this embodiment, the latest 3GPP release 14 NBIOT protocol is taken as an example. According to the rules of NBIOT download, all the operating frequency around the world ranges from 700 MHz to 2.2 GHz, covering 1.5 GHz, and the bandwidth of useful signal is 180 KHz. Therefore, the operating frequency of the RF front end according to the present disclosure ranges from 400 MHz to 2.4 GHz, covering 2 GHz, and the bandwidth of useful signal is 180 KHz.

Generally, the reflection coefficient S11 is used for describing the matching performance of the RF front-end of the broadband receiver and the antenna impedance, and the noise NF is used to show the minimum signal receiving performance. Therefore, the reflection coefficient S11 and the NF are two important indexes of the RF front-end of the broadband receiver. Generally, the reflection coefficient S11 of the RF front end of a broadband receiver being less than −10 dB in the useful frequency band indicates that the impedance matching has a smaller impact on the system. The smaller the noise figure NF is, the better the system performance is. However, the RF front end of the broadband receiver in the conventional technology has a poor NF in a broadband frequency range, especially for a zero-IF broadband receiver architecture and a narrow NBIOT useful signal bandwidth, because the IF signal noise after frequency conversion is greatly influenced by the device flicker noise 1/f.

Since the low-noise amplification module 10 is the first block of the RF front end of the broadband receiver, the NF of the low-noise amplification module 10 is critical to the performance of the entire system. Therefore, the noise cancelling effect of the low-noise amplification module 10 plays a decisive role on NF of the RF front end of the entire broadband receiver. For the zero-IF and low-IF frameworks of wireless communication in the Internet of Things, the present disclosure minimizes the influence of the noise introduced by the circuit on the system by using a noise cancelling structure and input structure of a low flicker noise 1/f PMOS.

Figure 3A:
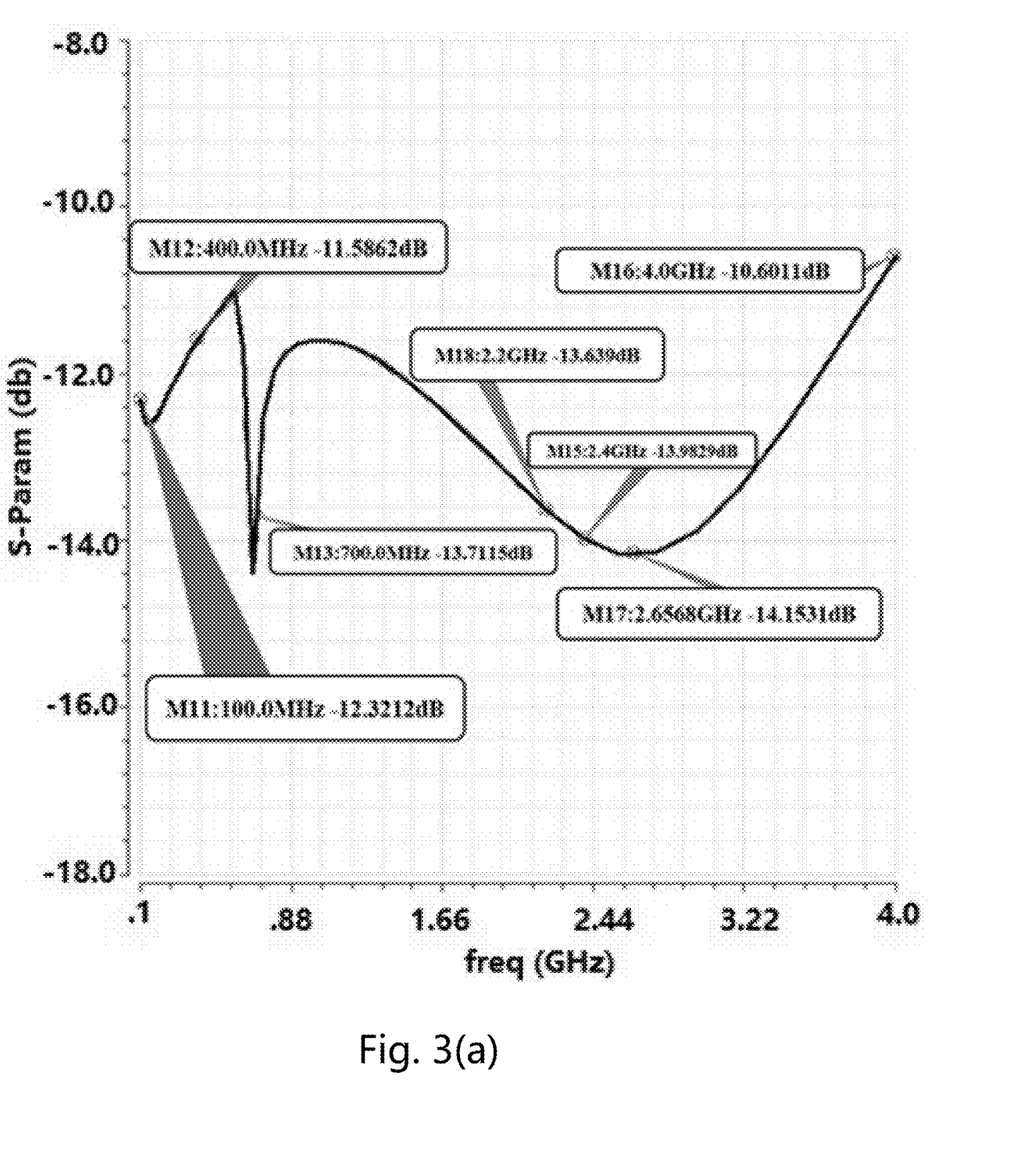
Figure 3B:
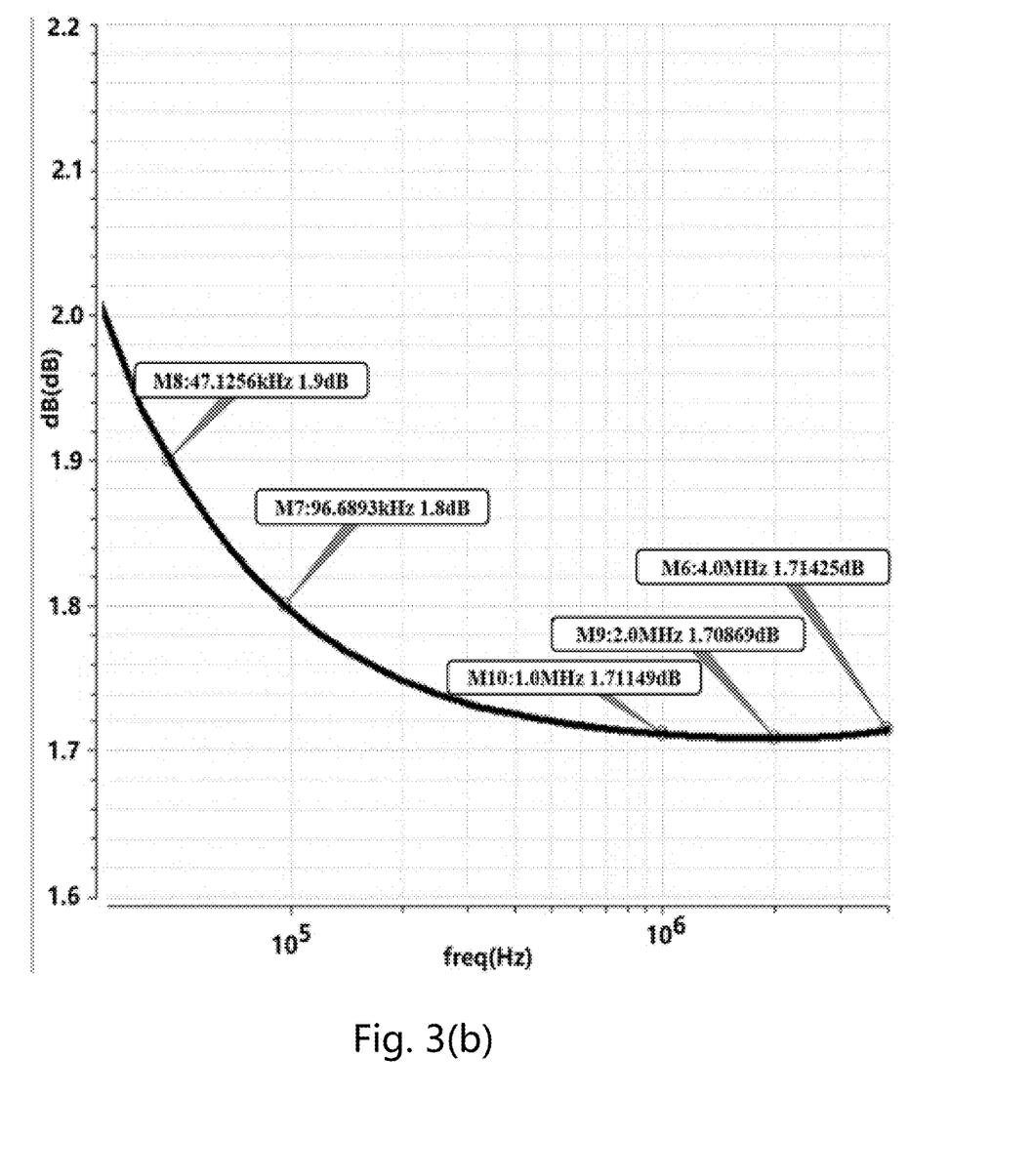

Based on the latest GFFDSOI 22 nm process, the RF front end of the low-power and fully-automatically adjusted broadband receiver of the present disclosure can be simulated and verified by using Cadence software. The reflection coefficient S11 and NF are shown in FIG. 3 (a) and FIG. 3 (b), with the supply voltage for 0.8V. The simulated results of the RF front end of the present disclosure show that a reflection coefficient S11 is less than −10 dB in the range of 100 MHz to 4 GHz, and a NF of the system ranges from 30 KHz to 4 MHz is less than 2 dB, thereby which can meet the requirements of NBIOT protocol. Compared with other RF front-ends of broadband receivers, the present disclosure not only achieves better impedance matching and lower noise figure NF in the broadband range, but also completes frequency conversion of single-ended signals to differential signal in the broadband range, thereby avoiding the use of off-chip baluns and on-chip inductors and greatly reducing chip area.

Figure 4:
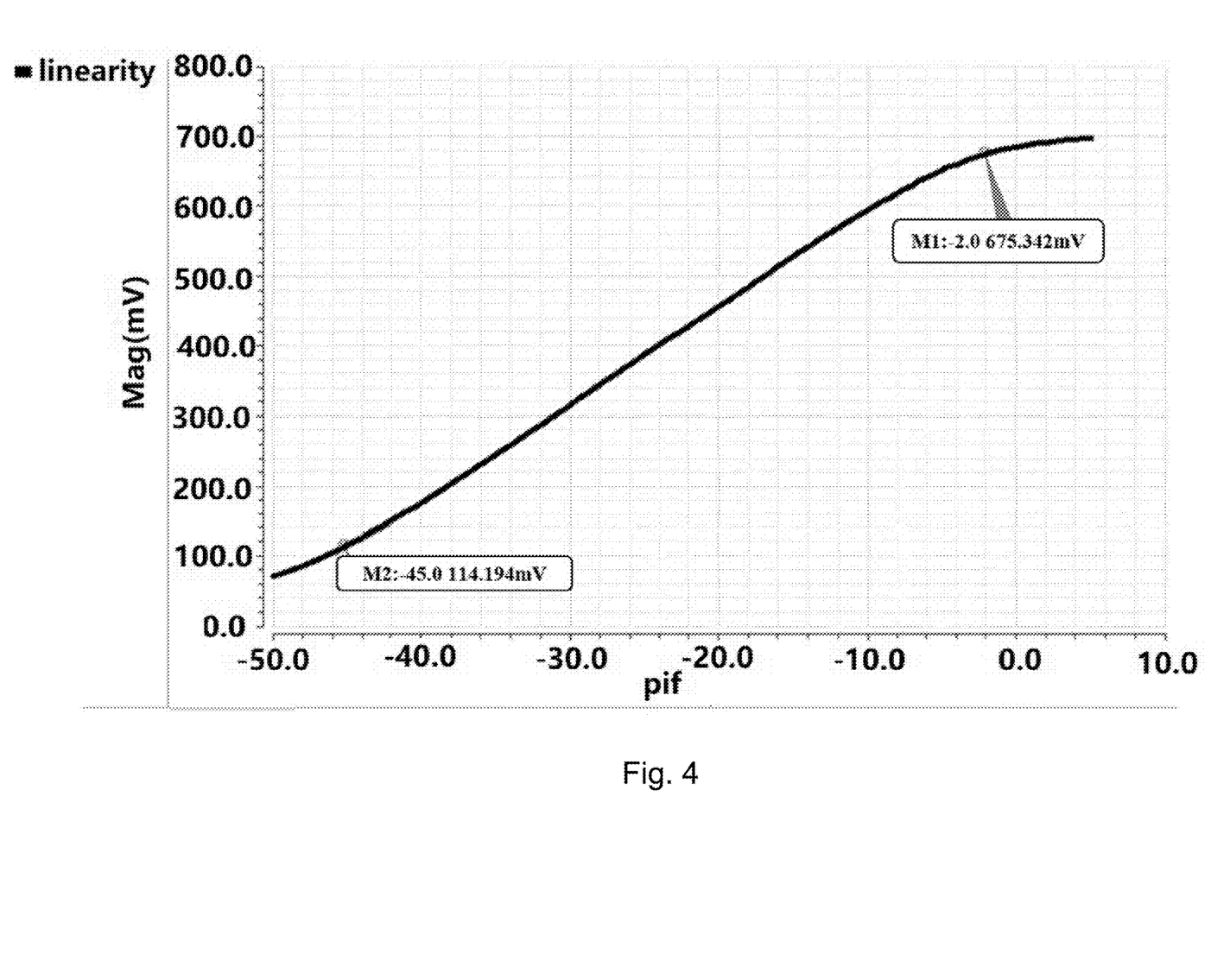
FIG. 4 is a schematic diagram of the linear output of the signal strength indicator of the RF front end of a low power consumption and fully automatic adjustable broadband receiver according to the present disclosure.

In order to show the linear detection characteristics of the received signal strength indicator module 60 to the intermediate-frequency differential voltage signal output by the transimpedance 30, the linear relations of the input signal to output signal of the RF front-end of the low-power and fully-automatically adjustable broadband receiver of the present disclosure is shown in FIG. 4. It can be seen from FIG. 4 that the received signal intensity indicator module 60 has a wider detection range and a smaller detection error.

Figure 5:
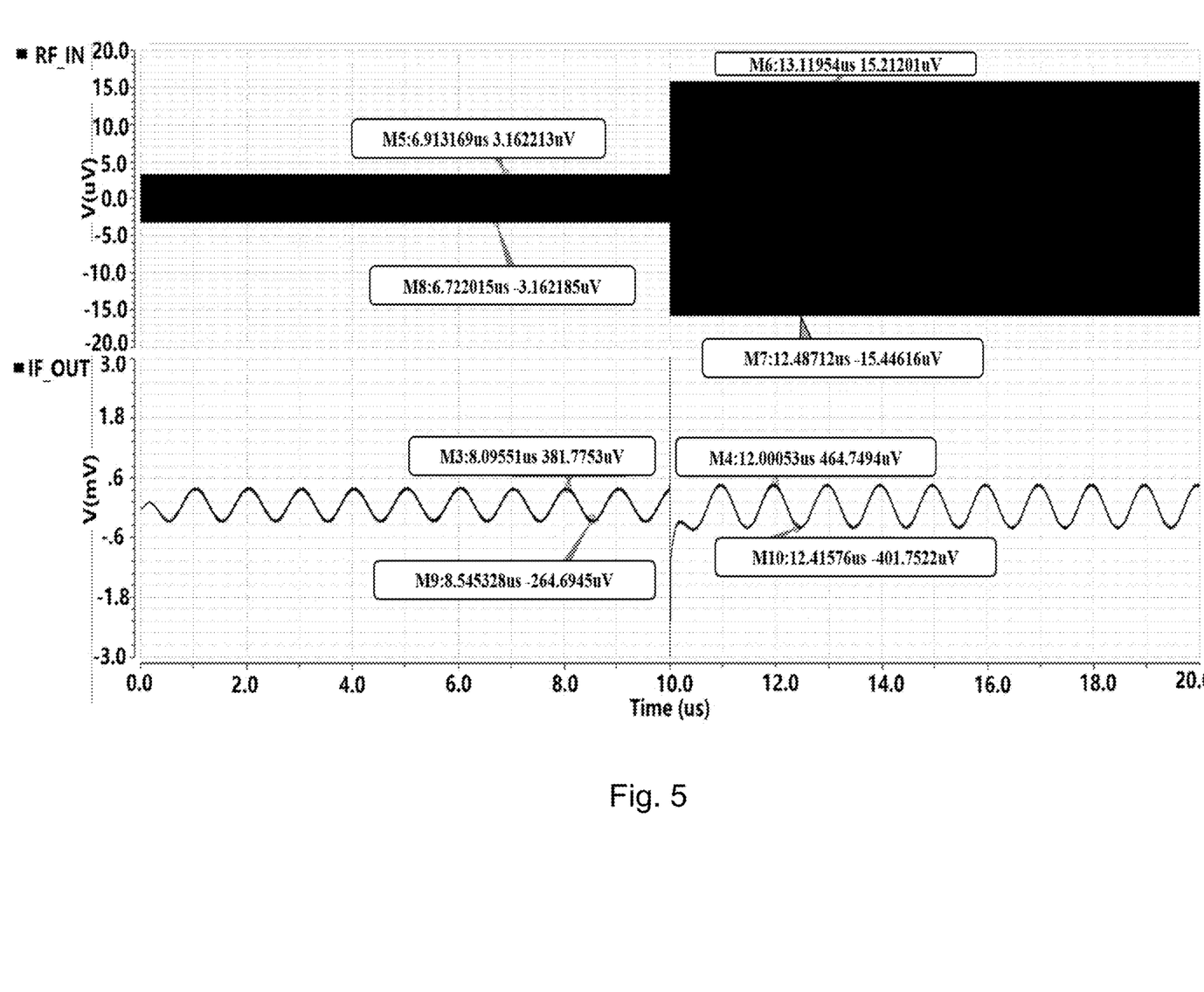
FIG. 5 is an automatically adjustable time-domain diagram of the RF front end of a low power consumption and fully automatic adjustable broadband receiver according to the present disclosure.

Meanwhile, the received signal strength indicator module 60 sends the corresponding control signals by using the digital processing module 602 based on the linear detection results of the analog processing module 601. Thereby the feedback resistor of the of the amplifier 101 of the low-noise amplification module 10 and the resistors of transimpedance 30 by the amplification control path can be flexibly adjusted, so as to achieve automatically adjusting the gain of RF front-end of the low-power and fully-automatically adjustable broadband receiver according to the intensity of the input RF signal. The transient simulation is shown in FIG. 5. The top part of FIG. 5 shows the RF single-ended input signal, and the bottom part of FIG. 5 shows the intermediate frequency differential output signal. The power of the input signal is −100 dBm and −88 dBm respectively, the power of the input signal in the first 10 uS is −100 dBm, and the power of the input signal after 10 uS is −88 dBm. The top part of FIG. 5 shows that the RF single-ended input signal has a significant amplitude change at the 10 uS, and the bottom part of FIG. 5 clearly shows that the received signal strength indicator module 60 automatically adjusts the signal amplitude through the control path based on the intensity of the received signal.

Of course, FIG. 5 briefly describes the automatically adjustment process of RF front-end of a low power consumption and fully automatic adjustable broadband receiver of the present disclosure, and the actual circuits can more efficiently and accurately complete the automatic adjustment. Therefore, according to the wireless communication requirements of the Internet of Things, the RF front-end of low power consumption and fully automatic adjustable broadband receiver of the present disclosure can achieve low noise, high integration and automatic adjustment. Moreover, all other control signals are controlled by SPI, thereby which further increasing the flexibility of the system.

In conclusion, the RF front-end of low power consumption and fully automatic adjustable broadband receiver of the present disclosure adopts a noise canceling current structure with feedback resistor. The present disclosure achieves low noise in the broadband range and the better impedance matching with the RF antenna without off-chip RF matching network. Moreover, the present disclosure transforms the single-ended voltage signals to differential current signals avoiding the use of off-chip baluns and supports the adjustment of the signal amplitude. The present disclosure can perform linearly analysis and comparison by using analog module based on the differential output signal and mismatch degree, and then send the gain control signal and differential mismatch control signal through the digital module, so as to make the intermediate frequency differential voltage signal meet the requirements of amplitude and mismatch degree of the system.

The present disclosure can achieve broadband RF signal receiving and meet the requirements of low power consumption, low noise and high integration by using the noise cancelling structure. The present disclosure can achieve fully automatic adjustment of gain and flexible switching of different bandwidths according to system requirements, and support zero-IF framework and low-IF framework of wireless communication receivers. The signal amplification and frequency conversion between modules are current transmission mode, which avoids problems of impedance matching in traditional voltage transmission mode. The present disclosure can meet the requirement of wireless communication wide coverage and achieve automatic adjustment of signal transmission. Therefore, the present disclosure can effectively overcome some shortcomings in the current technology and have high industrial value.

The above-mentioned embodiments merely illustrate the principle of the present disclosure and its effects, but are not intended to limit the present disclosure. Those skilled in the technology can modify or change the above embodiments without departing from the content and the scope of the present disclosure. Therefore, all the equivalent modifications or changes made by knowledgeable in technology without departing from the content and technical ideas disclosed by the present disclosure should still be covered by the claims of the present disclosure.

The invention claimed is:

1. A radio frequency (RF) front end of a low power consumption and fully automatic adjustable broadband receiver, comprising
    a low-noise amplification module, amplifying an broadband single-ended RF signal, and converting an amplified broadband single-ended RF signal into differential current signal, wherein the low-noise amplification module is allowed to adjust an amplification factor;
    a local oscillator, generating a local oscillator signal;
    a quadrature mixer, connected to the low-noise amplification module and the local oscillator, and quadraturely mixing the differential current signal and the local oscillator signal, so as to generate two intermediate frequency differential current signals;
    a transimpedance amplifier, connected to the quadrature mixer, and converting the two intermediate frequency differential current signals into two intermediate frequency differential voltage signals;
    an input second-order interception point (IIP2) calibration module, connected to the quadrature mixer, and adjusting the local oscillator signal received by the quadrature mixer, so as to reduce influence of the radio frequency front end IIP2; and
    a received signal strength indicator module, connected to the transimpedance amplifier, wherein the received signal strength indicator module comprises an analog processing module and a digital processing module; the analog processing module compares the two intermediate frequency differential voltage signals to obtain differential signal amplitude and a mismatch degree; the digital processing module generates a first amplification factor control signal and a differential mismatch control signal according to the differential mismatch degree, sends the first amplification factor control signal and the differential mismatch control signal to the low noise amplification module, and generates a second amplification factor control signal, and sends the second amplification factor control signal to the transimpedance amplifier, thereby making the two intermediate frequency differential voltage signals meet requirements of system amplitude and mismatch.

2. The RF front end of a low power consumption and fully automatic adjustable broadband receiver according to claim 1, wherein the low-noise amplification module comprises an amplifier, a first differential amplifier output module, and a second differential amplifier output module; an input end of the amplifier is connected to the broadband radio frequency signal, an output end of the amplifier is connected to the first differential amplification output module, an output end of the first differential amplification output module is connected to the quadrature mixer, and an input end of the second differential amplification output module is connected to the broadband radio frequency signal, an output end of the second differential amplification output module is connected to the quadrature mixer.

3. The RF front end of a low power consumption and fully automatic adjustable broadband receiver according to claim 1, wherein the quadrature mixer uses a passive switch structure of complementary N-metal-oxide-semiconductor (NMOS) and P-metal-oxide-semiconductor (PMOS), and the output has ground filter capacitors.

4. The RF front end of a low power consumption and fully automatic adjustable broadband receiver according to claim 1, wherein the transimpedance amplifier comprises a differential operational amplifier, two capacitors, and two resistors; two ends of the capacitors are connected to an input end and an output end of the differential operational amplifier, respectively, and two ends of the resistors are connected to an input end and an output end of the differential operational amplifier, respectively.

5. The RF front end of a low power consumption and fully automatic adjustable broadband receiver according to claim 1, wherein the RF front end of a low power consumption and fully automatic adjustable broadband receiver supports the frameworks of zero-IF and low-IF receivers.

6. The RF front end of a low power consumption and fully automatic adjustable broadband receiver according to claim 1, wherein the frequency of the broadband single-ended radio frequency signal ranges from 400 MHz to 2.4 GHz.

7. The RF front end of a low power consumption and fully automatic adjustable broadband receiver according to claim 1, further comprising an serial peripheral interface (SPI) interface to adjust bandwidth of the low power consumption and fully automatic adjustable broadband receiver.

8. The RF front end of a low power consumption and fully automatic adjustable broadband receiver according to claim 1, wherein the RF front end of a low power consumption and fully automatic adjustable broadband receiver is used for wireless communication and signal transmission of a wide coverage Internet of Things (IoT).

* * * * *